(12) United States Patent
Balachandran

(10) Patent No.: US 7,791,518 B2
(45) Date of Patent: Sep. 7, 2010

(54) FLICKER NOISE REDUCTION IN CONTINUOUS TIME (CT) SIGMA DELTA MODULATORS (SDMS)

(75) Inventor: Ganesh Balachandran, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/171,777

(22) Filed: Jul. 11, 2008

(65) Prior Publication Data

US 2010/0007538 A1    Jan. 14, 2010

(51) Int. Cl.
*H03M 1/66* (2006.01)
(52) U.S. Cl. .......................... 341/144; 375/247
(58) Field of Classification Search .......... 341/143–170
See application file for complete search history.

(56) References Cited

U.S. PATENT DOCUMENTS

| | | | | |
|---|---|---|---|---|
| 6,477,148 B1 * | 11/2002 | Gardenfors et al. | ......... | 370/280 |
| 6,507,624 B1 * | 1/2003 | Jachim et al. | ............... | 375/316 |
| 6,567,025 B2 * | 5/2003 | Schreier et al. | ............ | 341/143 |
| 6,584,157 B1 * | 6/2003 | Van Der Zwan et al. | .... | 375/247 |
| 6,690,313 B1 * | 2/2004 | McKay et al. | ............... | 341/144 |
| 7,106,809 B2 * | 9/2006 | Whikehart et al. | .......... | 375/316 |
| 7,180,435 B2 * | 2/2007 | Chen | ............................ | 341/61 |
| 7,378,995 B2 * | 5/2008 | Chen | ............................ | 341/61 |
| 7,463,170 B2 * | 12/2008 | Kong et al. | ................... | 341/61 |
| 7,463,180 B2 * | 12/2008 | Nara | ........................... | 341/155 |
| 2006/0109064 A1 * | 5/2006 | Toncich et al. | ............... | 333/133 |
| 2008/0013639 A1 * | 1/2008 | Rick et al. | ................... | 375/260 |

* cited by examiner

*Primary Examiner*—Lam T Mai
(74) *Attorney, Agent, or Firm*—Wade J. Brady, III; Frederick J. Telecky, Jr.

(57) ABSTRACT

Embodiments of a system for processing a signal may include a receiver configured to receive an input analog signal and an up converter coupled with the receiver and configured to up convert the analog signal to an up converted analog signal. Embodiments may further include an amplifier coupled with the up converter and configured to amplify the up converted analog signal to generate an amplified signal and also a bandpass filter coupled with the amplifier and configured to filter the amplified signal to generate a filtered analog signal. According to embodiments, the filtered analog signal may be fed to a quanitizer of the ADC. Intermediate signals made thus avoid the flicker noise region typically associated with an integrator of the ADC and may minimize the quantization noise associated with converting higher frequency analog signals.

19 Claims, 3 Drawing Sheets

FLICKER NOISE REDUCTION IN CONTINUOUS TIME (CT) SIGMA DELTA MODULATORS (SDMS)

BACKGROUND

Embodiments relate generally to signal processing and, more particularly, to analog to digital conversion.

In some moderate bandwidth sigma-delta analog-to-digital converter (ADC) applications, flicker noise may be a significant problem. Examples of such applications may include audio and GSM, which may be economically significant markets. Flicker noise may be noise that is characterized by a 1/f relationship such that lower frequencies tend to contribute more to the noise. This flicker noise problem may be a significant issue with circuits fabricated with CMOS devices having a size of 45 nm and 65 nm.

Attempts have been made to reduce flicker noise and its effects. One approach to reduce flicker noise may be to increase the devices sizes away from 45 nm. The result, however, may be an ADC that may be 2 to 4 times the size if flicker noise were not a problem. In addition to the unwanted size increase, parasitic capacitances may also increase. To combat this, current consumption may be increased to keep the parasitic poles from decreasing. It is known that low frequency parasitic poles may cause instability within ADCs.

Therefore, there remains, as yet an unfulfilled need for an ADC that reduces the impact of flicker noise but also provide a small device/circuit size and avoids impacting current and power consumption.

SUMMARY

Embodiments relate to a system and method for processing a signal. According to embodiments, an input analog signal may be received and up converted to an up converted analog signal. This up converted analog signal may then be amplified to generate an amplified signal which, in turn, may be bandpass filtered to generate a filtered analog signal. The filtered analog signal may then be ready to be fed to a quanitizer of the ADC.

According to embodiments, the intermediate signals may avoid the flicker noise region typically associated with an integrator of the ADC and may reduce the quantization noise associated with converting higher frequency analog signals.

Other embodiments may become readily apparent to those skilled in the art from the following detailed description, wherein it is shown and described only various embodiments by way of illustration. As will be realized, other and different embodiments and its several details may be capable of modification in various other respects, all without departing from the spirit and scope of illustrated embodiments. Accordingly, the drawings and description are to be regarded as illustrative in nature and not as restrictive.

DRAWINGS

DESCRIPTION

The description set forth below in connection with the appended drawings is intended as a description of various embodiments and is not intended to represent the only embodiments. The description includes specific details for the purpose of providing a thorough understanding of certain embodiments. However, it will be apparent to those skilled in the art that the invention may be practiced without these specific details. In some instances, well known structures and components are shown in block diagram form in order to avoid obscuring the concepts of the invention.

Figure 1:
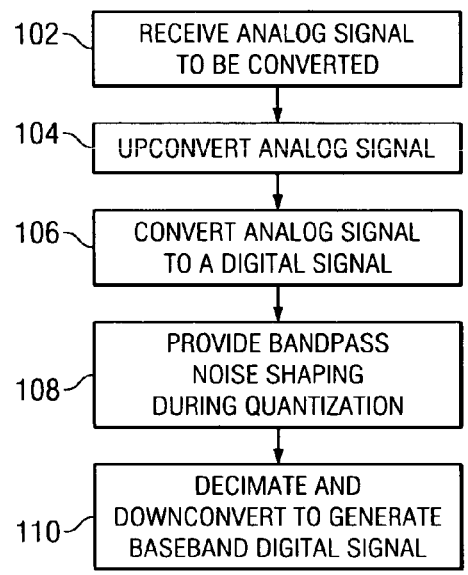
FIG. 1 depicts a method of providing analog-to-digital conversion according to embodiments.

FIG. 1 depicts a flowchart of a method of implementing an ADC according to embodiments. In step 102 an analog signal is acquired from any of a variety of known sources using well known techniques. Filtering and signal shaping can take place during signal acquisition using methods and techniques known to one of ordinary skill. In certain embodiments, the analog signal has a bandwidth of between 0 to 1 MHz. According to embodiments, this frequency range can be more or less depending on each specific application contemplated. For example, a bandwidth of about 0 to 100 kHz is contemplated within some embodiments. According to embodiments, however, a frequency bandwidth of about 0 to 1 MHz may be used to provide specific values for different components and circuitry. One of ordinary skill will recognize that these specific values are provided so that a concrete example may be used to assist in understanding the principles of embodiments, and are not intended to be limited to only these specific values.

In step 104, the acquired analog signal is up converted to a higher frequency. According to embodiments, the frequency may be significantly higher. Within the ADC there is typically a dominant noise producing amplifier that produces significant flicker noise when generating the signal to be input into the quanitizer. If for example, such an amplifier had a 1/f noise corner frequency of around 100 to 500 kHz, then the acquired signal would be up converted to just beyond 500 kHz. If the original baseband signal had a bandwidth of about 100 KHz, then the resulting up converted signal would lie significantly between 400 kHz and 600 kHz. As a result, the up converted signal is preferably set to at a frequency where the effect of flicker noise is significantly reduced.

One of ordinary skill will recognize that there are a multitude of functionally equivalent ways to up convert a signal from one frequency to another. However, certain embodiments contemplate using passive switches to affect the upconverison. According to embodiments, the passive switches may use only the signal and a local oscillator signal to produce the up conversion. This technique may result in lower power consumption than other techniques of up converting a signal frequency.

In step 106, the up converted signal may be quantized from an analog signal to a digital signal using sigma delta modulation. However, the quantization noise may be significant for the up converted signal. This may be because quantization noise generally increases with the frequency of the incoming analog signal. Accordingly, in step 108, bandpass noise shaping may be provided in the analog-to-digital conversion process so that quantization noise may be reduced in a band around the frequency of the up converted analog signal.

According to embodiments, the digital signal produced by the conversion process can then be decimated, in step 110, in a manner that down coverts the signal to a desired bandwidth. For example, a portion of U.S. Pat. No. 6,373,422 assigned to the present assignee describes how a proper sampling frequency and decimation factor of a decimation filter can be selected so that the filter can be used on the output of an ADC to produce a desired digital signal.

In accordance with the flowchart of FIG. 1, according to embodiments, a sigma-delta ADC can be constructed that accounts for flicker noise without requiring large amounts of surface area on a semiconductor circuit or requiring significantly higher power consumption.

Figure 2:
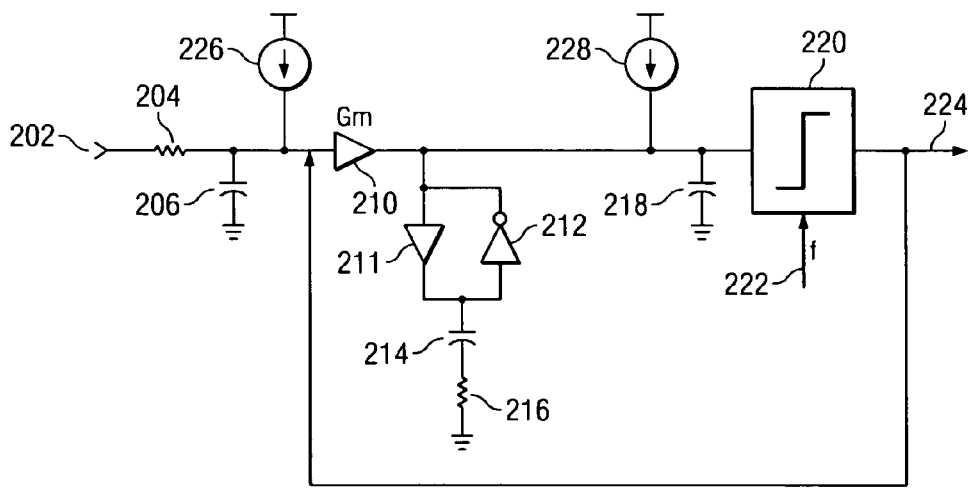
FIG. 2 depicts a circuit diagram useful for implementing the method of FIG. 1.

FIG. 2 illustrates a circuit of such an ADC according to embodiments. The up converted signal 202 may be received and resistor 204 and capacitor 206 many provide an input filter to amplifier 210. According to embodiments, amplifier 210 may provide the sigma-portion of the A-to-D process by integrating the input signal and producing an output that may be shaped by the resonant circuit formed by the gyrator (211, 212, 214, 216) and capacitor 218. The output of amplifier 210 may be input to quanitizer 220 to produce a digital output 224. Quanitizer 220 may be clocked at a frequency 222 (e.g., 200 MHz) as is known in the art. The output digital signal 224 may be fed back to the input of amplifier 210 to maintain a desired average output from amplifier 210. According to embodiments, sources 226 and 228 drive the various circuits.

Figure 3A:
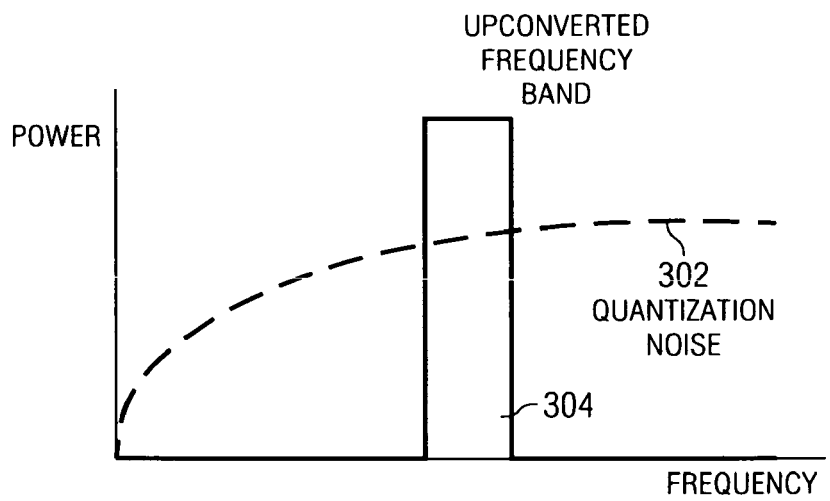
FIGS. 3A and 3B depict different noise spectrums of an ADC according to embodiments.
Figure 3B:
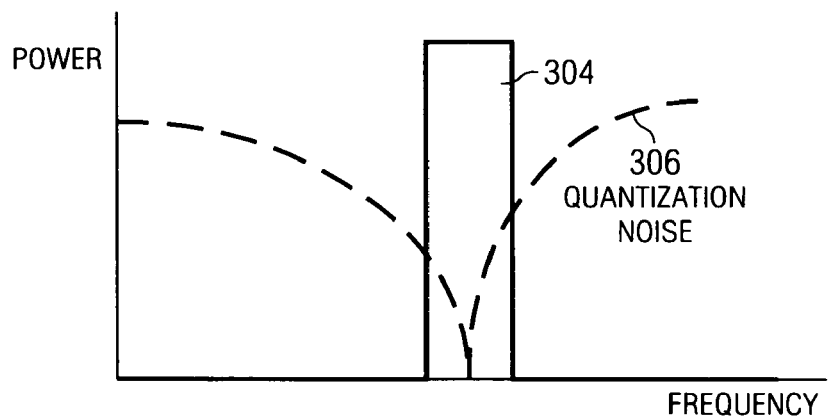

FIGS. 3A and 3B illustrate certain benefits of the circuit described with respect to FIG. 2. According to embodiments, one approach to combating flicker noise may be to simply up convert the input analog signal to a higher frequency. FIG. 3A depicts quantization noise 302 (of an ADC) as a function of frequency. As shown, the quantization noise may be significantly higher in the up converted band 304 than the original frequency band (not shown). Thus, while flicker noise was reduced, quantization noise may be increased. By implementing a bandpass filter to shape the noise, the signal illustrated by the graph of FIG. 3B can be achieved. The quantization noise 306 may be high at most frequencies but may be significantly reduced within the desired bandwidth range 304. Thus, according to embodiments, both flicker noise and quantization noise can be reduced.

Figure 4:
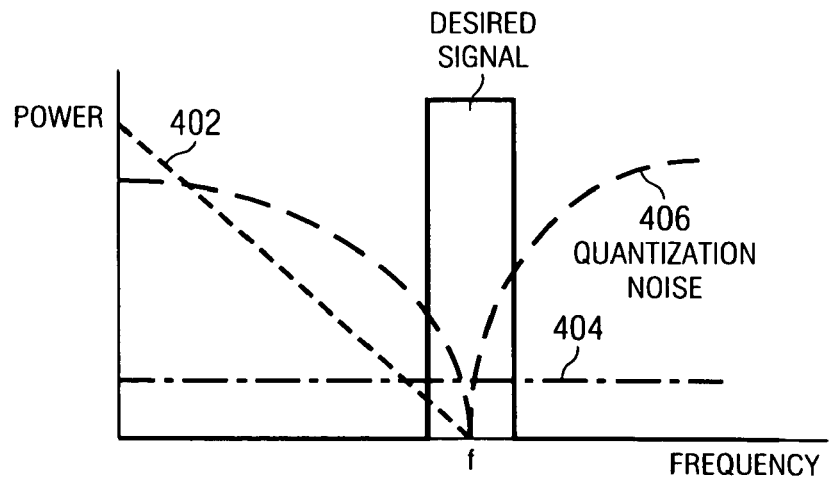
FIG. 4 depicts an exemplary noise spectrum attainable using the principles of embodiments.

FIG. 4 depicts the various types of noise commonly experienced in an ADC application. As mentioned previously, there may be flicker noise 402 that mainly results from the transconductance amplifier of the circuit. It may be highest at low frequencies and may decrease as the frequency increases. There may be background, or thermal, noise 404 that may be part of the operating environment. Then there may be quantization noise 406 that arises from the conversion process when quantitizing an analog signal into digital format. The graph of FIG. 4, shows the quantization noise profile 406 the same as FIG. 3B due to the inclusion of a bandpass filter. According to embodiments, this arrangement of up converting and having a bandpass noise shaper may reduce the noise of the ADC circuitry around the up conversion frequency, f.

According to embodiments, the circuit of FIG. 2 was an idealized circuit of an ADC. The circuit of FIG. 5 is another embodiment of a circuit showing greater detail and some extra components that can be eliminated for additional benefits as well.

The acquired analog signal 502 may be provided to up converter 504 that produces an output signal and its image. As described earlier, the use of passive switches that are switched on and off at a high frequency may be used to produce the up converted signals, according to embodiments. Each of the up converted signals may be shaped via respective resonant circuits 506, 508 and input to transconductance amplifier 510. Amplifier 510 preferably has a gain optimized for the up converted frequency and its respective outputs are further shaped by respective resonant circuits 512, 514. This shaped output may be converted into a digital signal by quanitizer 516 having a clocking frequency of $f_{CLK}$. The digital output 518 may be input to a down converter/decimation filter 524 to produce the desired digital output 526.

The output 518 of quanitizer 516 may be also provided as feedback to the amplifier 510 and quanitizer 516. In a particular embodiment, the output 518 may be converted via a switched current DAC 520 and fed back to quanitizer 516 and converted via a switched capacitance DAC 522 and fed back to the amplifier 510.

Figure 5:
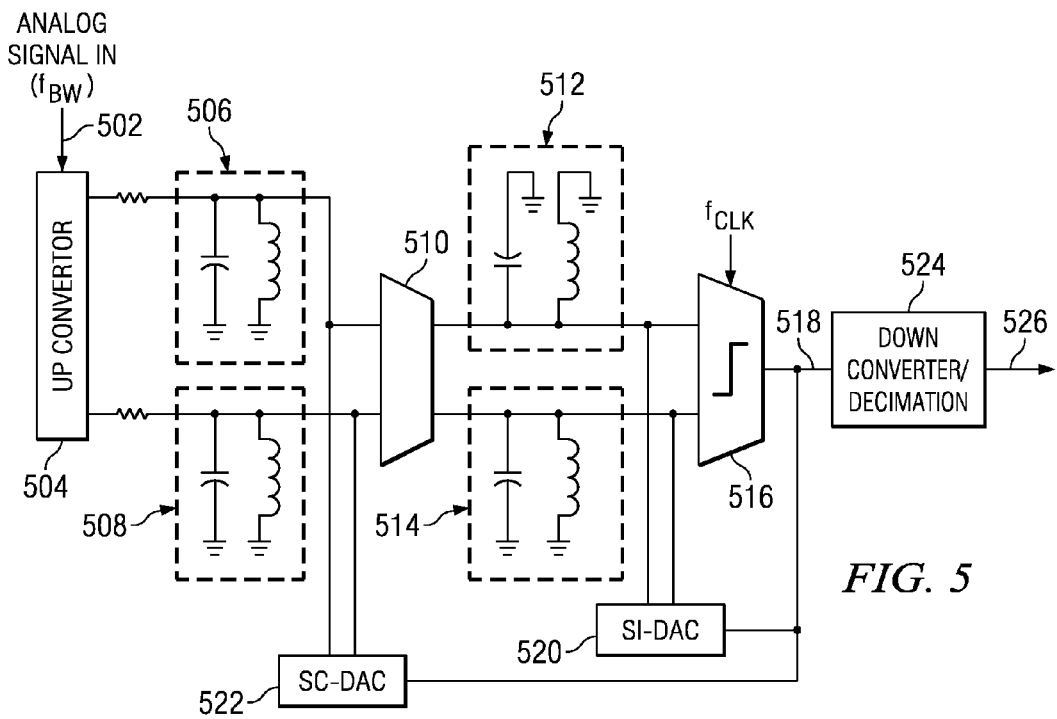
FIG. 5 depicts an embodiment of a circuit schematic that may be useful for implementing the method of FIG. 1.

The following example describes in an embodiment to illustrate one possible arrangement for the circuitry of FIG. 5. The input signal 502 may be between 0 to 1 MHz, for example. An appropriate chop frequency for the passive switches would be around 4 MHz while the clocking frequency of quanitizer 516 would be around 500 MHz. The various resonant circuits 506, 508, 512, 514 may have a resonant frequency of about 4 MHz (the chopping frequency). Amplifier 510 can be selected to have a high gain at around 4 MHz as well, instead of at around DC.

According to embodiments, the inductors shown in FIG. 5 may be implemented as a gyrator so that the circuit may be more easily fabricated on a silicon wafer.

Figure 6:
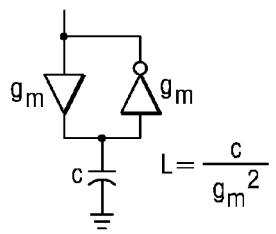
FIG. 6 depicts a gyrator circuit schematic useful for implementing an inductor-substitute for semiconductor fabrication, according to embodiments.

FIG. 6 illustrates an embodiment of a gyrator arrangement and provides a formula for calculating appropriate device values. One of ordinary skill in the art would recognize how to use a gyrator to replace the inductors shown in FIG. 5 as shown in FIG. 7 (see 702).

Figure 7:
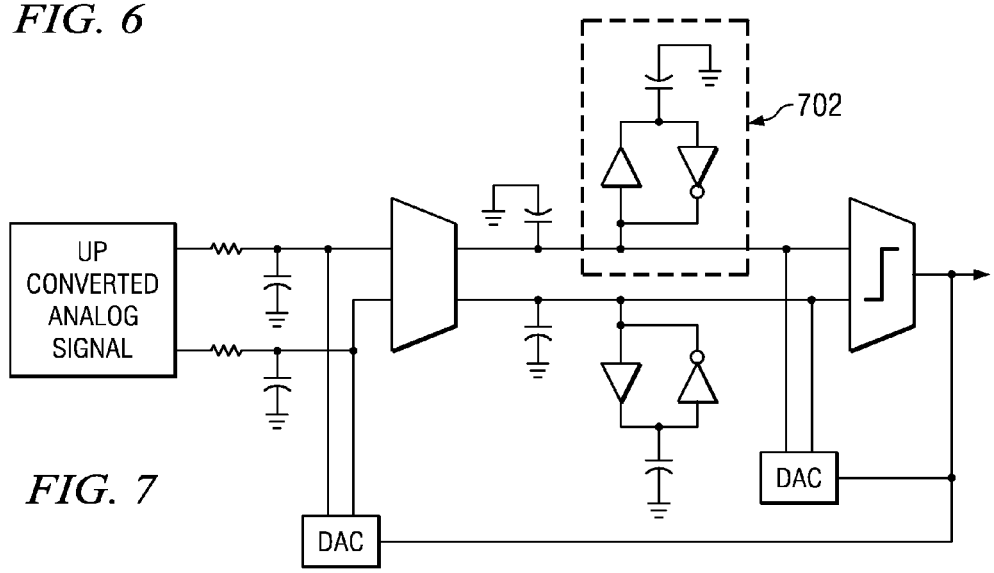
FIG. 7 depicts an embodiment of the circuit schematic of FIG. 5.

According to embodiments, one benefit of the circuit of FIG. 7 over that of FIG. 5 may be that the inductors prior to the amplifier have been eliminated. Significantly similar bandpass noise shaping may still occur but the power consumption may be reduced by the elimination of the input gyrator circuits used to implement the missing inductors. Removing the gyrator may be desirable because the input gyrator generates significant input noise because of the high-Q nature of the input and it consumes power as well. However, removing it causes a loss of about 16 dB (at 4 MHz.) Thus, a beneficial compromise may be to remove the input gyrator but attempt to minimize the chopping frequency of the passive switches used by the up converter. A chopping frequency of about 0.5 to 1 MHz may be particularly useful.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A system, comprising:
a receiver configured to receive an input analog signal;
an up converter coupled with the receiver and configured to up convert the analog signal to an up converted analog signal;
an amplifier coupled with the up converter and configured to integrate the up converted analog signal to generate an integrated signal; and
a bandpass filter coupled with the amplifier and configured to filter the integrated signal to generate a filtered analog signal;
wherein the up converter comprises at least one a passive switch switched at a chop frequency.

2. The system of claim 1, further comprising a quanitizer coupled with the bandpass filter and configured to convert the filtered analog signal into a digital signal.

3. The system of claim 2, further comprising a down converter coupled with the quanitizer and configured to down convert the digital signal.

4. The system of claim 3, wherein the down converter includes a decimation filter.

5. The system of claim 1, wherein the up is configured to up convert the analog signal to frequency of approximately a MHz.

6. The system of claim 5, wherein the chop frequency is selected based on a flicker noise characteristic of the amplifier.

7. The system of claim 5, wherein the bandpass filter has a band pass substantially centered around the chop frequency.

8. The system of claim 1, wherein the bandpass filter comprises at least one gyrator.

9. The system of claim 2, wherein the digital signal is fed back as an input to the amplifier.

10. The system of claim 2, wherein the digital signal is fed back as an input to the converter.

11. A system, comprising:
a receiver configured to receive an input analog signal below 1 MHz;
an up converter coupled with the receiver and configured to up convert the analog signal to an up converted analog signal having a resulting frequency of at least 1 MHz;
an amplifier coupled with the up converter and configured to integrate the up converted analog signal to generate an integrated signal, the amplifier selected to have a flicker noise corner frequency below the resulting frequency;
a bandpass filter coupled with the amplifier and configured to filter the integrated signal to generate a filtered analog signal, the bandpass filter having a bandpass region centered substantially around the resulting frequency; and
a quanitizer coupled with the bandpass filter and configured to convert the filtered analog signal into a digital signal.

12. The system of claim 11, further comprising a down converter coupled with the quanitizer and configured to down convert the digital signal.

13. The system of claim 12, wherein the down converter includes a decimation filter.

14. The system of claim 11, wherein the up converter comprises at least one a passive switch switched at a chop frequency.

15. The system of claim 14, wherein the chop frequency is selected based on a flicker noise characteristic of the amplifier.

16. The system of claim 11, wherein the bandpass filter has a band pass substantially centered around the chop frequency.

17. The system of claim 11, wherein the bandpass filter comprises at least one gyrator.

18. The system of claim 11, wherein the digital signal is fed back as an input to the amplifier.

19. The system of claim 11, wherein the digital signal is fed back as an input to the up converter.

* * * * *